United States Patent
Hung et al.

(10) Patent No.: US 10,692,762 B2
(45) Date of Patent: *Jun. 23, 2020

(54) SEMICONDUCTOR DEVICE WITH GATE STACK

(71) Applicant: TAIWAN SEMICONDUCTOR MANUFACTURING CO., LTD., Hsinchu (TW)

(72) Inventors: Hua-Li Hung, Hsinchu (TW); Chih-Lun Lu, New Taipei (TW); Hsu-Yu Huang, Tainan (TW); Tsung-Fan Yin, Kaohsiung (TW); Ying-Ting Hsia, Kaohsiung (TW); Yi-Wei Chiu, Kaohsiung (TW); Li-Te Hsu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/126,164

(22) Filed: Sep. 10, 2018

(65) Prior Publication Data

US 2019/0019727 A1    Jan. 17, 2019

Related U.S. Application Data

(63) Continuation of application No. 15/223,946, filed on Jul. 29, 2016, now Pat. No. 10,074,563.

(51) Int. Cl.
| | | |
|---|---|---|
| *H01L 29/78* | (2006.01) | |
| *H01L 21/768* | (2006.01) | |
| *H01L 23/535* | (2006.01) | |
| *H01L 29/08* | (2006.01) | |
| *H01L 29/06* | (2006.01) | |

(Continued)

(52) U.S. Cl.
CPC .. *H01L 21/76897* (2013.01); *H01L 21/76805* (2013.01); *H01L 23/485* (2013.01); *H01L 23/535* (2013.01); *H01L 29/0653* (2013.01); *H01L 29/0847* (2013.01); *H01L 29/66545* (2013.01); *H01L 29/66795* (2013.01);
(Continued)

(58) Field of Classification Search
None
See application file for complete search history.

(56) References Cited

U.S. PATENT DOCUMENTS 7,528,453 B2   5/2009  Holz et al.
8,741,723 B2   6/2014  Chi
(Continued)

*Primary Examiner* — Chandra Chaudhari
(74) *Attorney, Agent, or Firm* — Birch, Stewart, Kolasch & Birch, LLP

(57) ABSTRACT

A semiconductor device is provided. The semiconductor device includes a gate stack over a semiconductor substrate and a spacer element over a sidewall of the gate stack. The spacer element has a lower portion and an upper portion, the lower portion has a substantially uniform width. The upper portion becomes wider along a direction from a top of the spacer element towards the lower portion, and a bottom of the upper portion is higher than a top of the gate stack. The semiconductor device also includes a dielectric layer surrounding the gate stack and the spacer element. The semiconductor device further includes a conductive contact penetrating through the dielectric layer and electrically connected to a conductive feature over the semiconductor substrate.

20 Claims, 8 Drawing Sheets

(51) Int. Cl.
*H01L 29/66* (2006.01)
*H01L 23/485* (2006.01)

(52) U.S. Cl.
CPC ...... *H01L 29/7848* (2013.01); *H01L 29/7851* (2013.01); *H01L 29/7834* (2013.01)

(56) References Cited

U.S. PATENT DOCUMENTS 9,397,003 B1 7/2016 Niimi et al.
9,450,079 B2 * 9/2016 Cheng ................ H01L 29/7851

* cited by examiner

SEMICONDUCTOR DEVICE WITH GATE STACK

CROSS REFERENCE

This application is a Continuation application of U.S. patent application Ser. No. 15/223,946, filed on Jul. 29, 2016, the entire of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
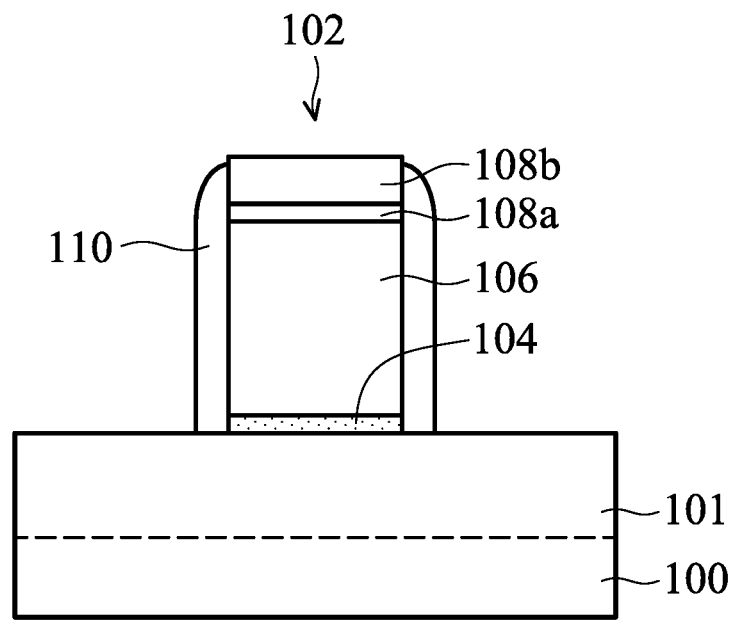
FIGS. 1A-1N are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
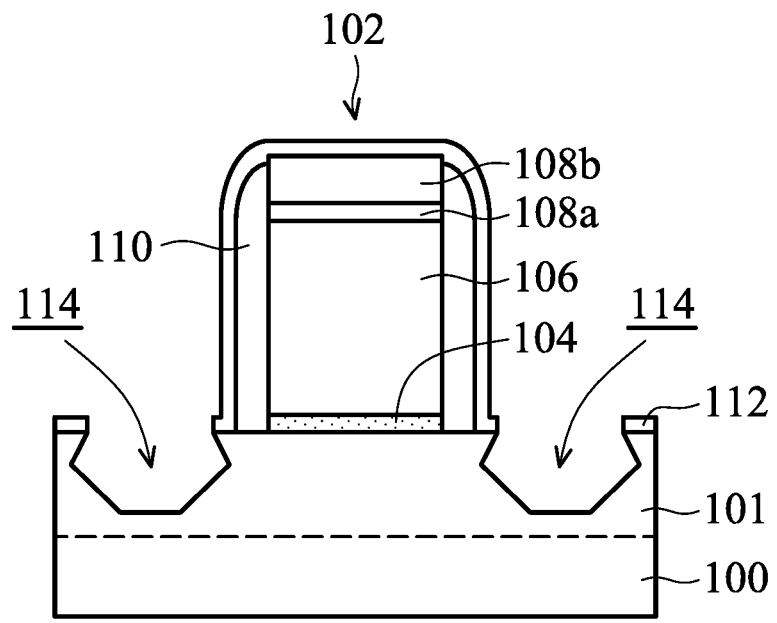
Figure 1C:
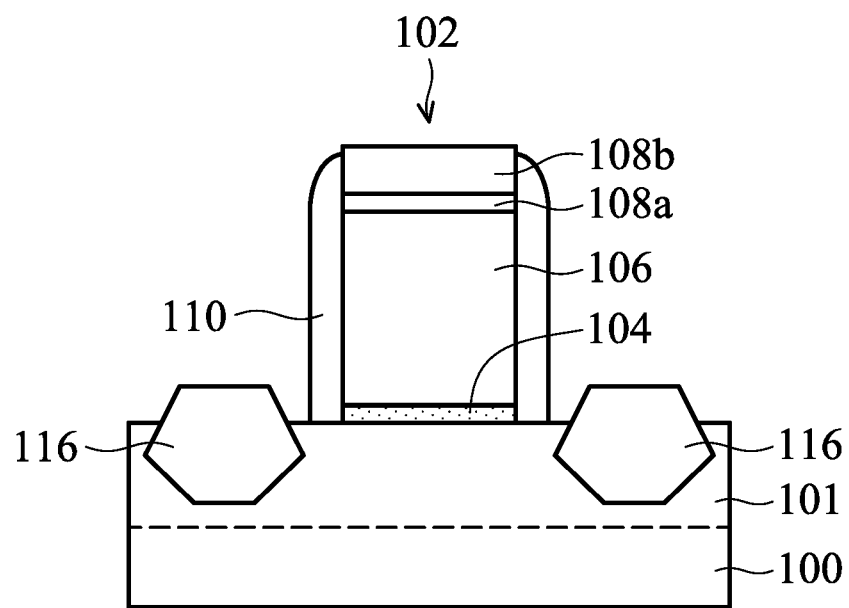
Figure 1D:
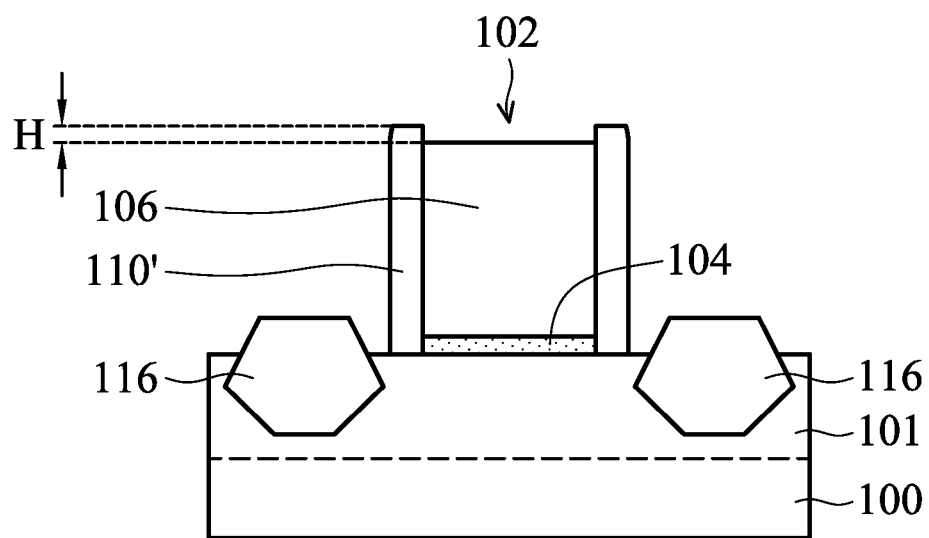
Figure 1E:
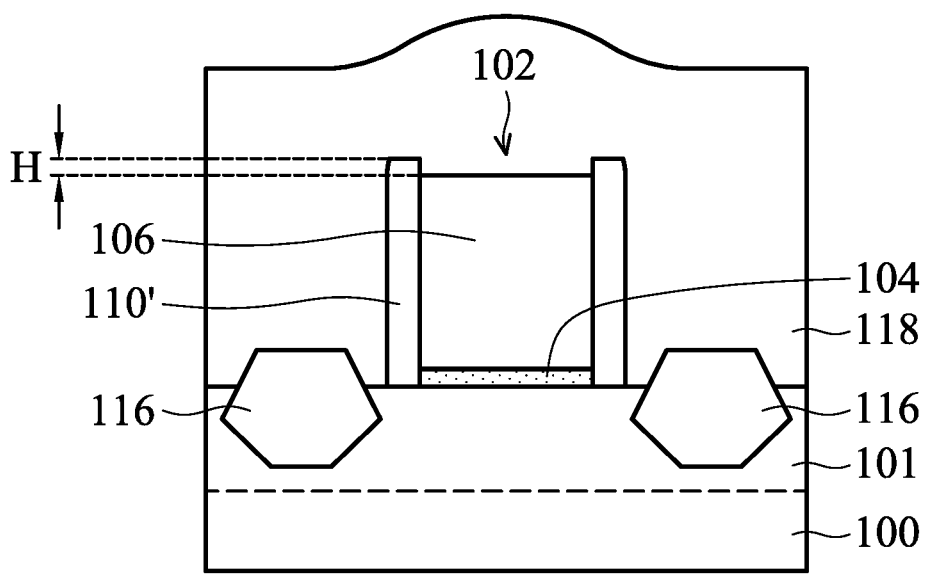
Figure 1F:
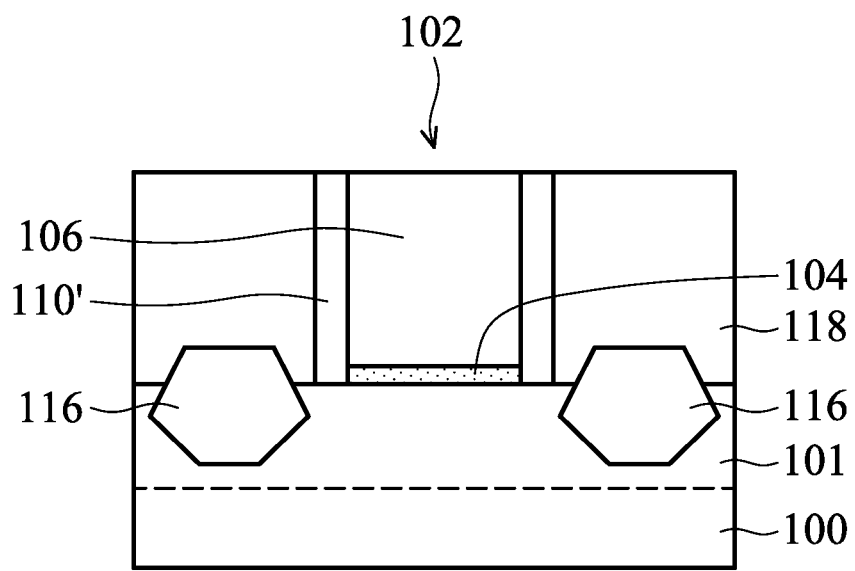
Figure 1G:
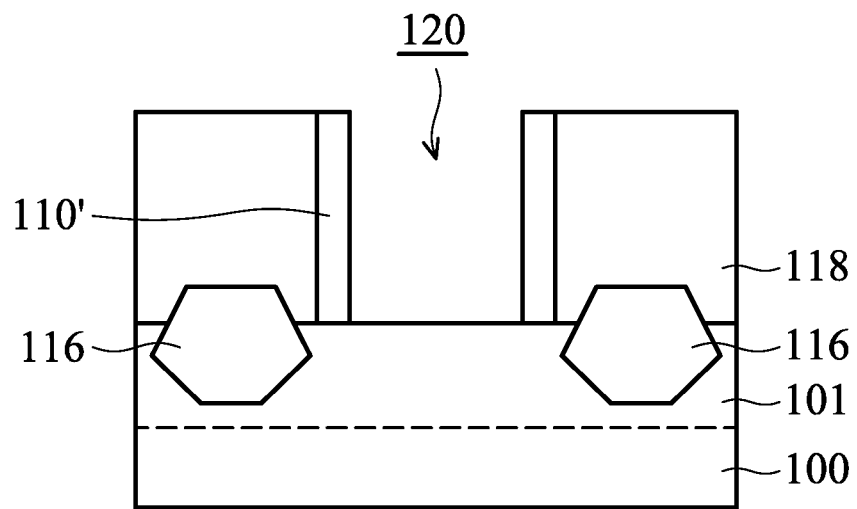
Figure 1H:
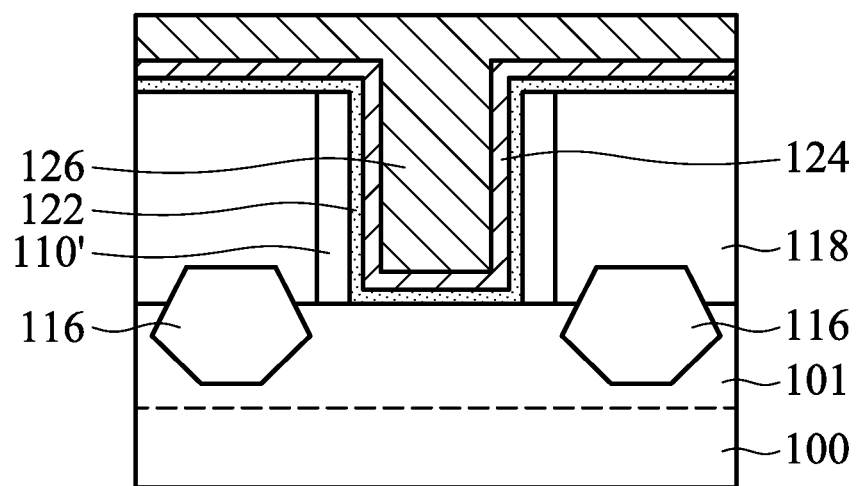
Figure 1I:
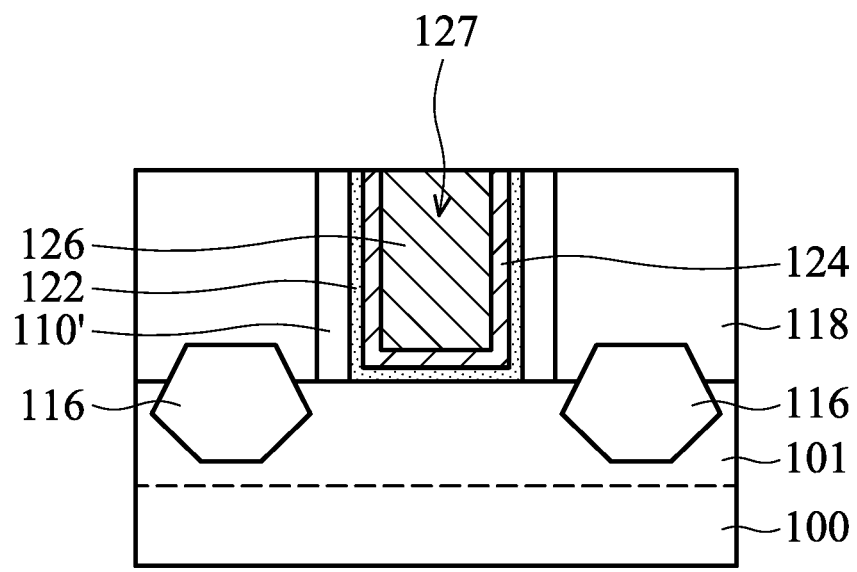
Figure 1J:
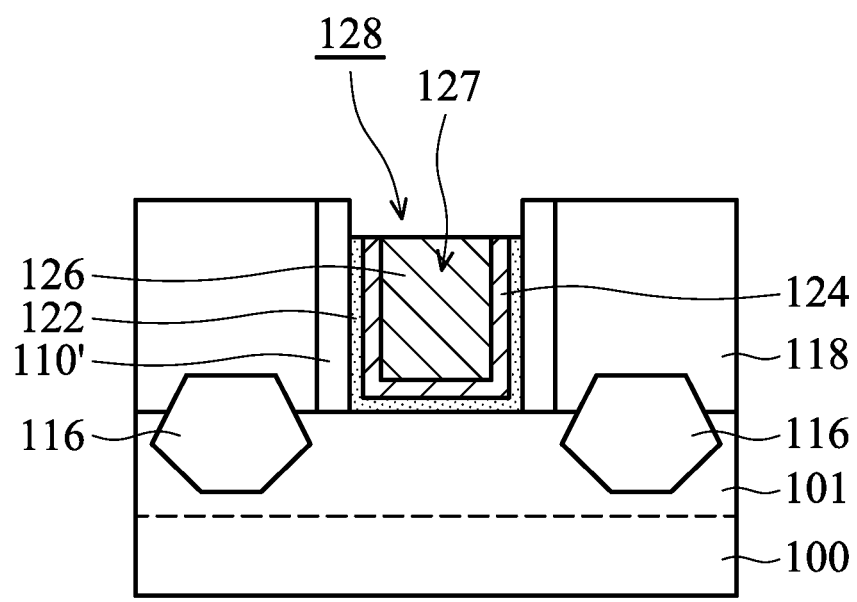
Figure 1K:
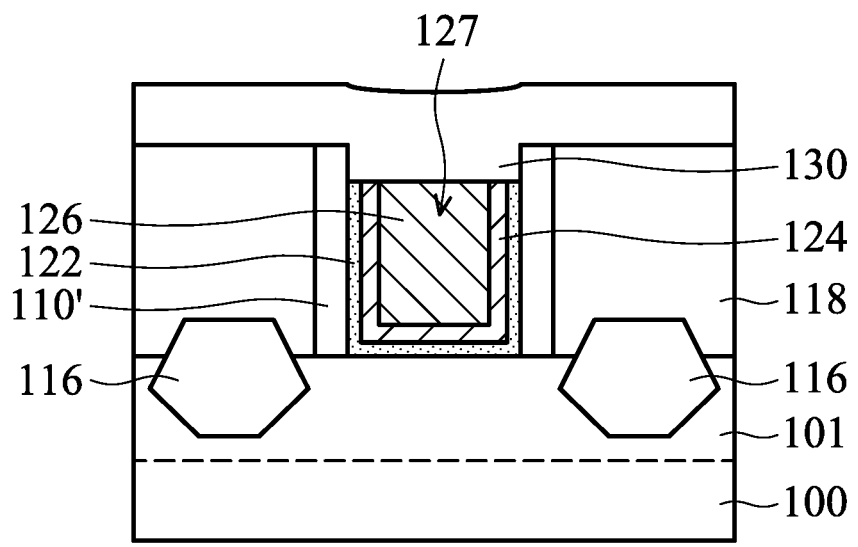
Figure 1L:
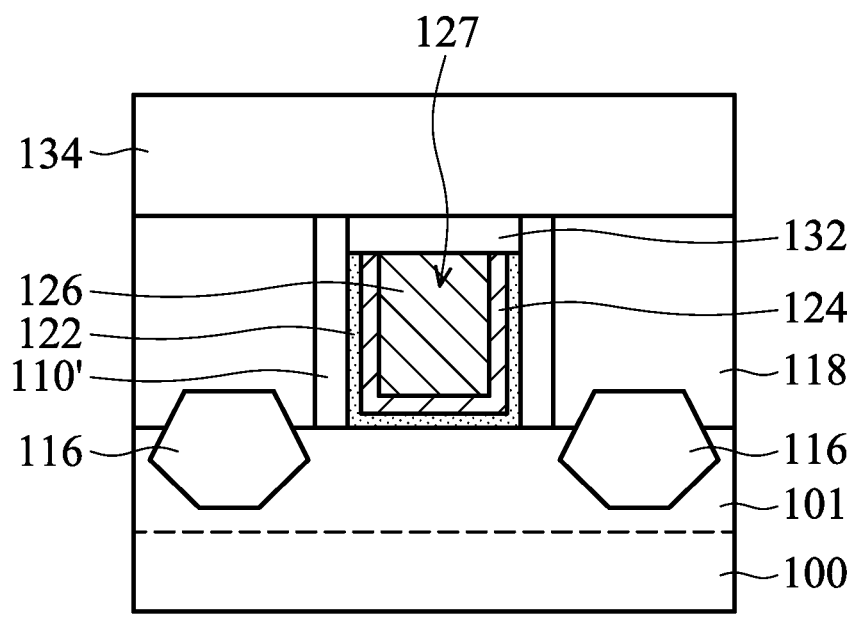
Figure 1M:
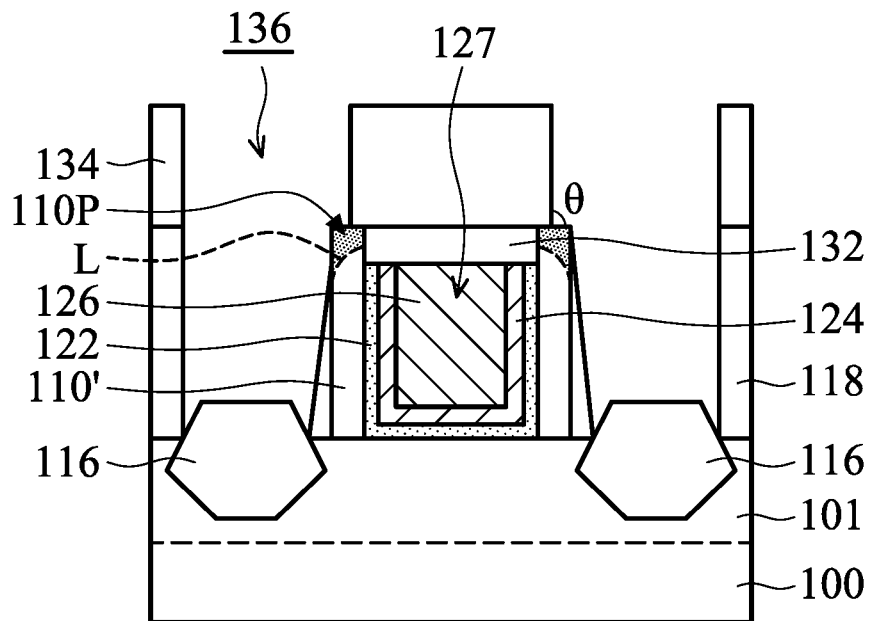
Figure 1N:
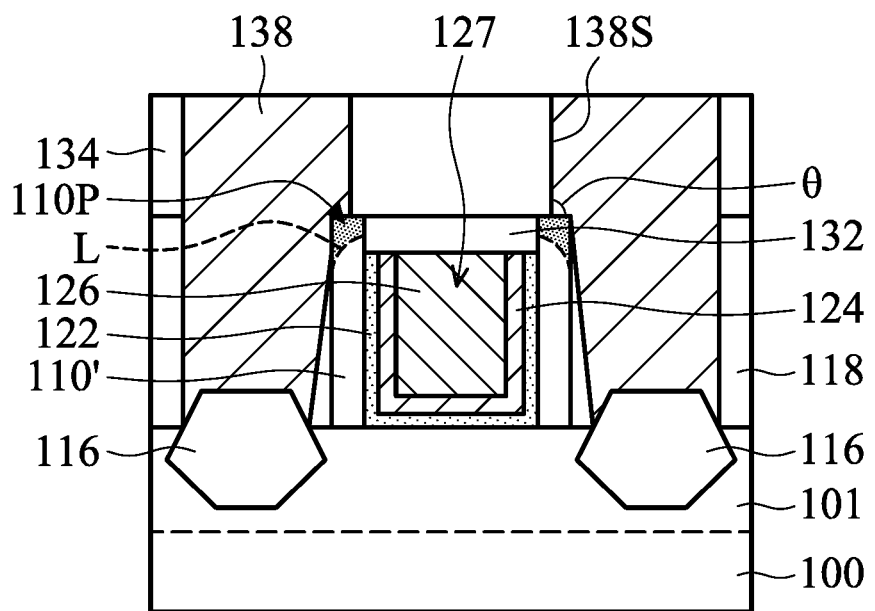

FIGS. 1A-1N are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, one or multiple fin structures 101 are formed. As shown in FIG. 1A, one of the fin structures (the fin structure 101) is shown. In some embodiments, multiple recesses (or trenches) (not shown) are formed in the semiconductor substrate 100. As a result, multiple fin structures including the fin structure 101 are formed between the recesses. In some embodiments, one or more photolithography and etching processes are used to form the recesses.

In some embodiments, isolation features (not shown) are formed in the recesses to surround a lower portion of the fin structure 101. The isolation features are used to define and electrically isolate various device elements formed in and/or over the semiconductor substrate 100. In some embodiments, the isolation features include shallow trench isolation (STI) features, local oxidation of silicon (LOCOS) features, another suitable isolation feature, or a combination thereof.

In some embodiments, a dielectric material layer is deposited over the semiconductor substrate 100. The dielectric material layer covers the fin structures including the fin structure 101 and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structure 101 is exposed. The planarization process may include a chemical mechanical polishing (CMP) process, a grinding process, an etching process, another applicable process, or a combination thereof. Afterwards, the dielectric material layer is etched back to below the top of the fin structure 101. As a result, the isolation features are formed. The fin structures including the fin structure 101 protrudes from the isolation features.

Afterwards, a gate stack 102 is formed over the fin structure 101, as shown in FIG. 1A in accordance with some embodiments. The gate stack 102 partially covers the fin structure 101. The gate stack 102 may covers the top and sidewalls of the fin structure 101 and extends over the isolation feature.

In some embodiments, a gate dielectric layer 104 is deposited over the isolation features and the fin structure 101. In some embodiments, the gate dielectric layer 104 is made of silicon oxide, silicon nitride, silicon oxynitride, dielectric material with high dielectric constant (high-K), another suitable dielectric material, or a combination thereof. In some embodiments, the gate dielectric layer 104 is a dummy gate dielectric layer which will subsequently be removed. In some other embodiments, the gate dielectric layer 104 is not formed.

In some embodiments, the gate dielectric layer 104 is deposited using a chemical vapor deposition (CVD) process, an atomic layer deposition (ALD) process, a thermal oxidation process, a physical vapor deposition (PVD) process, another applicable process, or a combination thereof.

Afterwards, a gate electrode 106 is formed over the gate dielectric layer 104 to cover a portion of the fin structure 101, as shown in FIG. 1A in accordance with some embodiments. In some embodiments, the gate electrode 106 is a dummy gate electrode which will be replaced with a metal gate electrode. In some embodiments, the gate electrode 106 is made of polysilicon. In some embodiments, the portion of the fin structure 101 under the gate electrode 101 serves as a channel region.

In some embodiments, a gate electrode layer is deposited over the gate dielectric layer 104 using a CVD process or another applicable process. In some embodiments, the gate electrode layer is made of polysilicon. Afterwards, a patterned hard mask element including a first mask element 108a and a second mask element 108b is formed over the gate electrode layer, in accordance with some embodiments. The patterned hard mask element may be used to pattern the gate electrode layer into one or more gate electrodes including the gate electrode 106 shown in FIG. 1A. In some embodiments, the gate dielectric layer 104 is also patterned, as shown in FIG. 1A. The gate electrode 106 and the gate dielectric layer 104 may together form the gate stack 102. In some embodiments, the gate stack 102 is a dummy gate stack and will be replaced with a metal gate stack. In some embodiments, the gate stack 102 surrounds side surfaces and a top surface of the fin structure 101 and further extends over the semiconductor substrate 100.

In some embodiments, the first mask element 108a is made of a nitrogen-containing dielectric material such as silicon nitride. In some embodiments, the second mask element 108b is made of an oxygen-containing dielectric material such as silicon oxide. In some embodiments, the second mask element 108b is thicker than the first mask element 108a.

In some embodiments, sealing elements (not shown) are formed over sidewalls of the gate stack 102. The sealing elements may be used to protect the gate stack 102 and assist in a subsequent process for forming lightly-doped source/drain (LDS/D) regions (not shown). In some embodiments, an ion implantation process is used to form the LDS/D regions. In some other embodiments, the sealing elements are not formed. In some other embodiments, the LDS/D regions are not formed.

Afterwards, spacer elements 110 are formed over sidewalls of the gate stack 102 and the mask elements 108a and 108b, as shown in FIG. 1A in accordance with some embodiments. The spacer elements 110 may be used to protect the gate stack 102 and assist in a subsequent process for forming source/drain features.

In some embodiments, the spacer element 110 is substantially free of oxygen. In some embodiments, the spacer element 110 contains carbon. In some embodiments, the spacer element 110 is made of silicon carbonitride. In some other embodiments, the spacer element 110 is made of silicon carbonitride, silicon carbide, another suitable material, or a combination thereof.

In some embodiments, a dielectric material layer is deposited over the semiconductor substrate 100 and the gate stack 102. The dielectric material layer may be deposited using a CVD process, an ALD process, a spin-on process, another applicable process, or a combination thereof. Afterwards, the dielectric material layer is partially removed using an etching process, such as an anisotropic etching process. As a result, the remaining portions of the dielectric material layer over the sidewalls of the gate stack 102 and the mask elements 108a and 108b form the spacer elements 110.

As shown in FIG. 1B, a patterned protection layer 112 is formed over the fin structure 101, the spacer elements 110, and the gate stack 102, in accordance with some embodiments. The patterned protection layer 112 has openings that expose portions of the fin structure 101 where source/drain features will be formed. In some embodiments, the patterned protection layer 112 is made of a nitrogen-containing dielectric material. For example, the patterned protection layer 112 is made of silicon nitride. In some embodiments, the patterned protection layer 112 is substantially free of carbon.

Afterwards, the fin structure 101 is partially removed through the openings of the patterned protection layer 112. For example, an etching process is used to partially remove the fin structure 101. As a result, recesses 114 are formed in the fin structure 101, as shown in FIG. 1B. In some embodiments, each of the recesses 114 laterally extends under one of the spacer elements 110. In some embodiments, each of the recesses 114 laterally extends under the gate stack 102.

As shown in FIG. 1C, conductive features such as source/drain features 116 are formed in the recesses 114, in accordance with some embodiments. In some embodiments, an epitaxial growth process is performed to epitaxially grown a semiconductor material on the exposed surface of the fin structure 101 to form the source/drain features 116, as shown in FIG. 1C. In some embodiments, the source/drain features 116 are also used as stressors that can apply strain or stress on the channel region between the source/drain features 116. The carrier mobility may be improved accordingly.

In some embodiments, the patterned protection layer 112 is removed, as shown in FIG. 1C. In some embodiments, the patterned protection layer 112 is removed after the formation of the source/drain features 116. In some other embodiments, the patterned protection layer 112 is removed before the formation of the source/drain features 116. In some embodiments, the patterned protection layer 112 is removed using an etching process, such as a wet etching process. In some embodiments, the spacer element 110 contains carbon, and is substantially not removed during the etching of the patterned protection layer 112. In some other embodiments, only a surface portion of the spacer element 110 is removed during the etching of the patterned protection layer 112. A wet etching process that has high selectivity to the spacer element 110 containing carbon may be used to remove the patterned protection layer 112.

As shown in FIG. 1D, the second mask element 108b and the first mask element 108a are removed to expose the gate electrode 106, in accordance with some embodiments. In some embodiments, the second mask element 108b and the first mask element 108a are removed using an etching process. In some other embodiments, the second mask element 108b is removed using a first etchant, and the first mask element 108a is then removed using a second etchant. The etchant used for removing the second mask element 108b has a high selectivity between the mask elements 108b containing oxygen and the spacer elements 110 containing substantially no oxygen. Therefore, after the removal of the mask elements 108b and 108a, the spacer element 110 is only slightly removed. Reference number 110' is used to designate the spacer element remained after being slightly removed.

In some embodiments, the top of each of the spacer elements 110' is not lower than the top of the gate stack 102. In some embodiments, the top of the spacer elements 110' are higher than the top of the gate electrode 106 by a distance H. The distance H may be in a range from about 5 Å to about 10 nm. In some other embodiments, the top of the spacer elements 110' are substantially coplanar with the top of the gate electrode 106. The spacer elements 110' may be used to prevent short circuiting between a subsequently formed metal gate stack and a subsequently formed conductive contact.

In some other cases, the spacer elements between the gate stack 102 is not substantially free of oxygen. The etchant used for removing the mask elements 108b may also partially remove the spacer elements 110 at a relatively high rate. In these cases, the remaining spacer elements after the removal of the mask elements 108b and 108a may have heights lower than that of the gate stack 102. The remaining spacer elements may also not have a sufficient thickness. As a result, short circuiting between the subsequently formed metal gate stack and the subsequently formed conductive contact may occur.

As shown in FIG. 1E, a dielectric layer 118 is formed over the semiconductor substrate 100 to surround the gate stack 102 and the spacer elements 110', in accordance with some embodiments. In some embodiments, the dielectric layer 118 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric layer 118 is deposited using a CVD process, an ALD process, a spin-on process, another applicable process, or a combination thereof.

As shown in FIG. 1F, a planarization process is used to thin the dielectric layer 118 until the gate electrode 106 is exposed. The planarization process may include a CMP process, a dry polishing process, a grinding process, an etching process, another applicable process, or a combination thereof.

As shown in FIG. 1G, the gate stack 102 is removed to form a recess 120 between the spacer elements 110', in accordance with some embodiments. In some embodiments, multiple etching operations are performed to remove the gate electrode 106 and the gate dielectric layer 104. The recess 120 exposes a portion of the fin structure 101 that may be used as a channel region.

As shown in FIG. 1H, metal gate stack layers including a gate dielectric layer 122, a work function layer 124, and a conductive filling layer 126 are deposited to fill the recess 120, in accordance with some embodiments. One or more other layers may be formed between these layers. For example, a barrier layer is formed between the gate dielectric layer 122 and the work function layer 124. A blocking layer may be formed between the work function layer 124 and the conductive filling layer 126.

In some embodiments, the gate dielectric layer 122 is made of a dielectric material with high dielectric constant (high-K). The gate dielectric layer 122 may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. The gate dielectric layer 122 may be deposited using an ALD process, a CVD process, a spin-on process, another applicable process, or a combination thereof.

The work function layer 124 is used to provide the desired work function for transistors to enhance device performance, such as improved threshold voltage. In some embodiments, the work function layer 124 is an n-type metal layer capable of providing a work function value that is suitable for the device, such as equal to or less than about 4.5 eV. In some embodiments, the work function layer 124 is a p-type metal layer capable of providing a work function value that is suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 124 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 124 may be fine-tuned to adjust the work function level. For example, a titanium nitride layer may be used as a p-type metal layer or an n-type metal layer, depending on the thickness and/or the compositions of the titanium nitride layer. In some embodiments, the work function layer 124 is deposited using a CVD process, an electroplating process, an electroless plating process, a PVD process, another applicable process, or a combination thereof.

In some embodiments, the conductive filling layer 126 is made of a metal material. The metal material may include tungsten, aluminum, cobalt, nickel, copper, another suitable material, or a combination thereof. In some embodiments, the conductive filling layer 126 is deposited using a CVD process, an electroplating process, an electroless plating process, a PVD process, another applicable process, or a combination thereof.

As shown in FIG. 1I, a planarization process is performed to remove the portions of the metal gate stack layers outside of the recess 120, in accordance with some embodiments. As a result, the remaining portions of the metal gate stack layers form a metal gate stack 127. The planarization process may include a CMP process or the like.

As shown in FIG. 1J, the metal gate stack 127 is partially removed to form a recess 128, in accordance with some embodiments. In some embodiments, the recess 128 is formed using an etching back process.

As shown in FIG. 1K, a protection material layer 130 is deposited over the dielectric layer 118 and the metal gate stack 127 to fill the recess 128, in accordance with some embodiments. In some embodiments, the protection material layer 130 is made of a material that is different from that of the spacer elements 110'. In some embodiments, the protection material layer 130 is made of a dielectric material. The dielectric material may include silicon nitride, silicon oxynitride, silicon carbide, silicon carbon nitride, another suitable material, or a combination thereof. In some embodiments, the protection material layer 130 is deposited using a CVD process, an ALD process, a spin-on process, another applicable process, or a combination thereof.

As shown in FIG. 1L, the portion of the protection material layer 130 outside of the recess 128 is removed, in accordance with some embodiments. As a result, the remaining portion of the protection material layer 130 in the recess 128 forms a protection element 132, as shown in FIG. 1L. In some embodiments, each of the spacer elements 110' covers a side surface of the protection element 132. In some embodiments, the top surface of the spacer element 132 is substantially coplanar with the protection element 132.

In some embodiments, a planarization process is used to partially remove the protection material layer 130 to achieve the formation of the protection element 132. In some embodiments, the planarization process includes a CMP process, a grinding process, a dry polishing process, an etching process, another applicable process, or a combination thereof.

Afterwards, a dielectric layer 134 is deposited over the dielectric layer 118, the spacer elements 110', and the protection element 132, as shown in FIG. 1L in accordance with some embodiments. The material and formation method of the dielectric layer 134 may be the same as or similar to those of the dielectric layer 118. In some embodiments, the dielectric layer 134 is in direct contact with the dielectric layer 118, the spacer elements 110', or the protection element 132. In some other embodiments, another intermediate layer is formed therebetween. For example, the intermediate layer is an etch stop layer or an adhesion layer.

As shown in FIG. 1M, contact openings 136 are formed in the dielectric layers 134 and 118 to expose the source/drain features 116, in accordance with some embodiments. The contact openings 136 are self-aligned with the source/drain features 116.

Because the spacer elements 110' are substantially free of oxygen, the spacer elements 110' are only slightly removed during the removal of the mask elements 108b and 108a. Therefore, each of the spacer elements 110' has sufficient height and thickness to provide sufficient protection to the metal gate stack 127 during the formation of the contact openings 136. The reliability and performance of the metal gate stack 127 are improved. As shown in FIG. 1M, there is an angle θ between a sidewall of the contact openings 136 and the top surface of one of the spacer elements 110'. In some embodiments, the angle θ is in a range from about 90 degrees to about 120 degrees.

The dashed line L defines the portion 110P of each of the spacer elements 110'. In some other cases where the spacer elements 110' are not oxygen-free, the portion 110P does not remain after the removal of the mask elements 108b and 108a. In these cases, the metal gate stack 127 may be damaged or removed during the etching process for forming the contact openings 136 since the protection of the spacer elements is not sufficient. Alternatively, the metal gate stack 127 may be damaged or removed during a subsequent salicidation process that involves a metal etching operation if portion 110P does not remain. In some other cases where the spacer elements 110' are not oxygen-free, the angle θ may be greater than about 130 degrees. The contact openings 136 may be close to the metal gate stack 127 or even expose the metal gate stacks 127.

As shown in FIG. 1N, conductive contacts 138 are formed in the contact openings 136, in accordance with some embodiments. In some embodiments, one of the conductive contacts 138 is in direct contact with the one of the spacer elements 110'. In some embodiments, one of the conductive contacts 138 is also in direct contact with the protection element 132. In some embodiments, the angle θ that is also between a sidewall 138S of one of the conductive contacts 138 and the top surface of one of the spacer elements 110' is in a range from about 90 degrees to about 120 degrees. The sidewall 138S may be surrounded by the dielectric layer 134. In some embodiments, the conductive contacts 138 cover portions of the spacer elements 110', as shown in FIG. 1N.

In some embodiments, one or more conductive material layers are deposited over the dielectric layer 134 to fill the contact openings 136. A planarization process is used afterwards to remove the portion of the conductive material layer outside of the contact openings 136. As a result, the remaining portions of the conductive material layer in the contact openings 136 form the conductive contacts 138, as shown in FIG. 1N.

In some embodiments, the conductive material layer is made of tungsten, aluminum, cobalt, nickel, copper, gold, platinum, titanium, another suitable material, or a combination thereof. In some embodiments, the conductive material layer is deposited using a CVD process, a PVD process, an electroplating process, an electroless plating process, another applicable process, or a combination thereof. Because the portion 110P of the spacer elements 110' still remain, short circuiting between the conductive contacts 138 and the metal gate stack 127 is prevented. The quality of the semiconductor device structure is significantly improved.

Figure 2:
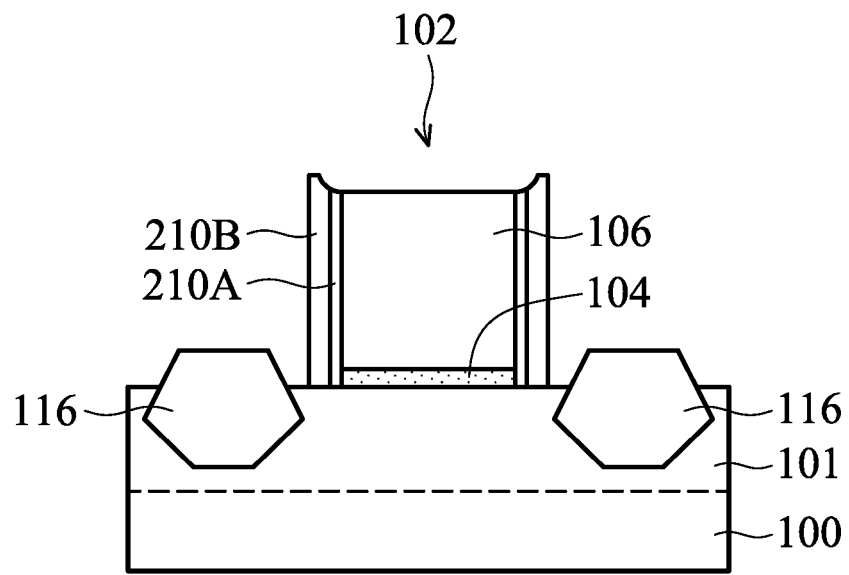
FIG. 2 is a cross-sectional view of one stage of a process for forming a semiconductor device structure, in accordance with some embodiments.

Many variations and/or modifications can be made to embodiments of the disclosure. FIG. 2 is a cross-sectional view of one stage of a process for forming a semiconductor device structure, in accordance with some embodiments.

FIG. 2 may show a stage that is similar to the stage shown in FIG. 1D. In some embodiments, spacer elements 210A and 210B are formed over sidewalls of the gate stack 102. In some embodiments, the material and formation method of the spacer element 210B are the same as or similar to those of the spacer elements 110'. In some embodiments, the spacer element 210A contains more oxygen than the spacer element 210B. In some embodiments, after the removal of the mask elements, the top surface of the spacer element 210B is higher than that of the spacer element 210A since the spacer element 210B is substantially free of oxygen. In some embodiments, the top surfaces of the spacer elements 210A and 210B are curved surfaces.

In some embodiments, the spacer element 210A is in direct contact with the spacer element 210B. In some other embodiments, there is another layer or element formed between the spacer elements 210A and 210B.

Figure 3:
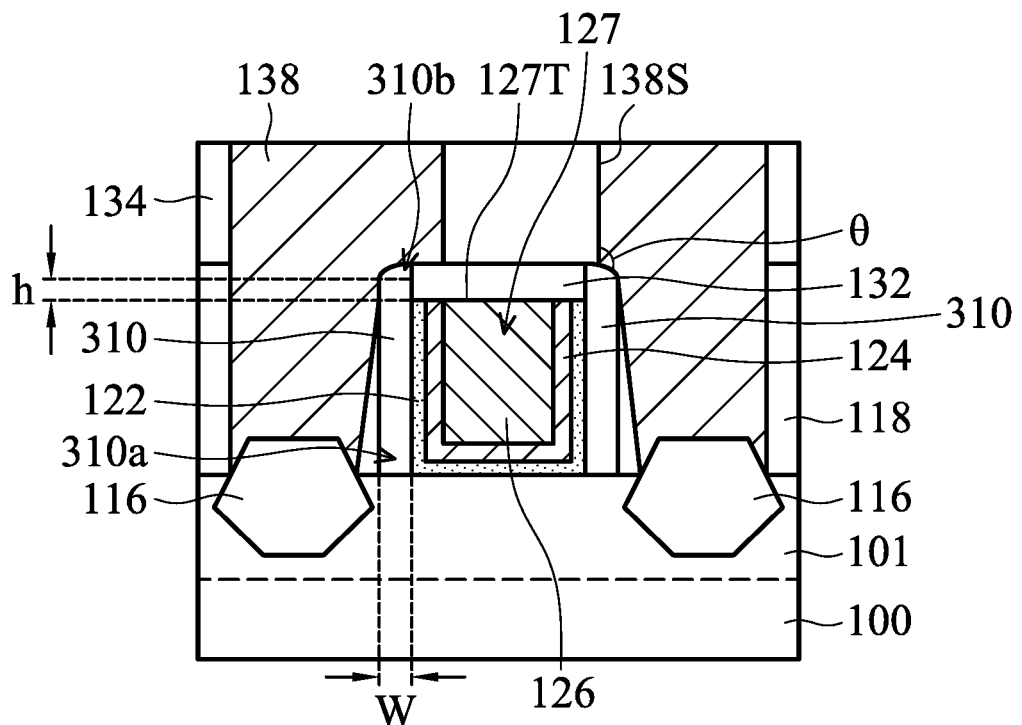
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments.

In some embodiments, the material and formation method of the spacer elements 310 are the same as or similar to those of the spacer elements 110'. In some embodiments, each of the spacer elements 310 has a lower portion 310a and an upper portion 310b. In some embodiments, the lower portion 310a has a substantially uniform width W. In some embodiments, the upper portion 310b gradually becomes wider along a direction from a top of the spacer element 310 towards the lower portion 310a. As shown in FIG. 3, the upper portion 310b gradually becomes as wide as the lower portion 310a. In some embodiments, the bottom of the upper portion 310b is higher than the top of the metal gate stack 127 by a distance h, as shown in FIG. 3.

In some embodiments, one of the conductive contacts 138 covers a portion of the protection element 132. In some embodiments, one of the conductive contacts 138 is in direct contact with the protection element 132. In some embodiments, the top surface of one of the spacer elements 310 is a curved surface. In these cases, the angle θ between the sidewall 138S and the top surface of one of the spacer elements 310 is greater than about 90 degrees. The angle θ may be in a range from about 95 degrees to about 120 degrees.

Embodiments of the disclosure form a spacer element that is substantially free of oxygen on a gate stack. The spacer element may also contain carbon. Therefore, the spacer element can have sufficient height and thickness even after the removal of mask elements originally on the gate stack. Afterwards, a metal gate stack is formed to replace the gate stack, and a conductive contact is formed to electrically connect to a source/drain feature adjacent to the metal gate stack. Due to the sufficient height and thickness of the spacer element, the metal gate stack is prevented from being damaged or removed during the formation of the conductive contact. The performance and reliability of the semiconductor device structure are significantly improved.

In accordance with some embodiments, a semiconductor device structure is provided. The semiconductor device structure includes a gate stack over a semiconductor substrate and a spacer element over a sidewall of the gate stack. The spacer element is substantially free of oxygen. The semiconductor device structure also includes a dielectric layer over the semiconductor substrate, and the dielectric layer surrounds the gate stack and the spacer element. The semiconductor device structure further includes a conductive contact penetrating through the dielectric layer and electrically connected to a conductive feature over the semiconductor substrate. An angle between a sidewall of the conductive contact and a top surface of the spacer element is in a range from about 90 degrees to about 120 degrees, and the conductive contact covers a portion of the spacer element.

In accordance with some embodiments, a semiconductor device structure is provided. The semiconductor device structure includes a gate stack over a semiconductor substrate and a spacer element over a sidewall of the gate stack. The spacer element is substantially free of oxygen, and the spacer element has a lower portion and an upper portion. The upper portion gradually becomes wider along a direction from a top of the spacer element towards the lower portion, and a bottom of the lower portion is higher than a top of the gate stack. The semiconductor device structure also includes a protection element over the gate stack, and the spacer element covers a side surface of the protection element. The semiconductor device structure further includes a dielectric layer over the semiconductor substrate, and the dielectric layer surrounds the gate stack and the spacer element. In addition, the semiconductor device structure includes a conductive contact penetrating through the dielectric layer and electrically connected to a conductive feature over the semiconductor substrate. The conductive contact covers a portion of the spacer element.

In accordance with some embodiments, a method for forming a semiconductor device structure is provided. The method includes forming a gate stack over a semiconductor substrate and forming a spacer element over a sidewall of the gate stack. The spacer element is substantially free of oxygen. The method also includes removing a mask element over the gate stack after the formation of the spacer element, and a top of the spacer element is not lower than a top of the gate stack after the removal of the mask element. The method further includes forming a dielectric layer over the semiconductor substrate to surround the gate stack and the spacer element and replacing the gate stack with a metal gate stack after the formation of the dielectric layer. In addition, the method includes forming a conductive contact in the dielectric layer to electrically connect a conductive feature over the semiconductor substrate, and the conductive contact covers a portion of the spacer element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate stack over a semiconductor substrate;
a spacer element over a sidewall of the gate stack;
a dielectric layer surrounding the gate stack and the spacer element;
a conductive contact penetrating through the dielectric layer and electrically connected to a conductive feature over the semiconductor substrate, wherein the conductive contact covers a portion of the spacer element; and
a protection element over the gate stack, wherein the conductive contact is directly above a portion of the protection element.

2. The semiconductor device as claimed in claim 1, wherein the spacer element contains carbon.

3. The semiconductor device as claimed in claim 1, wherein the spacer element covers a side surface of the protection element.

4. The semiconductor device as claimed in claim 3, wherein a top surface of the spacer element is substantially coplanar with the protection element.

5. The semiconductor device as claimed in claim 3, wherein the protection element comprises silicon nitride, and the spacer element comprises silicon carbonitride.

6. The semiconductor device as claimed in claim 3, wherein the conductive contact is in direct contact with the spacer element.

7. The semiconductor device as claimed in claim 1, wherein the conductive contact is in direct contact with the protection element.

8. The semiconductor device as claimed in claim 1, further comprising a semiconductor fin over the semiconductor substrate, wherein the gate stack partially covers the semiconductor fin, and a portion of the conductive feature is in the semiconductor fin.

9. The semiconductor device as claimed in claim 1, further comprising a second spacer element between the spacer element and the sidewall of the gate stack, wherein the second spacer element contains more oxygen than the spacer element.

10. The semiconductor device as claimed in claim 1, wherein an angle between a sidewall of the conductive contact and a top surface of the spacer element is in a range from about 90 degrees to about 120 degrees.

11. A semiconductor device, comprising:
    a gate stack over a semiconductor substrate;
    a spacer element over a sidewall of the gate stack, wherein the spacer element has a lower portion and an upper portion, the lower portion has a substantially uniform width, the upper portion becomes wider along a direction from a top of the spacer element towards the lower portion, and a bottom of the upper portion is higher than a top of the gate stack;
    a dielectric layer surrounding the gate stack and the spacer element; and
    a conductive contact penetrating through the dielectric layer and electrically connected to a conductive feature over the semiconductor substrate.

12. The semiconductor device as claimed in claim 11, wherein an interface of a bottom of the upper portion and a top of the lower portion is higher than a top of the gate stack, and a width of the upper portion at the bottom of the upper portion is the same as the substantially uniform width of the lower portion, and becomes narrower along the direction from the bottom of the upper portion towards the top of the upper portion.

13. The semiconductor device as claimed in claim 11, further comprising a second spacer element between the spacer element and the sidewall of the gate stack, wherein the second spacer element contains more oxygen than the spacer element.

14. The semiconductor device as claimed in claim 11, further comprising a protection element over the gate stack, wherein the protection element and the spacer element are made of different materials.

15. The semiconductor device as claimed in claim 14, wherein the conductive contact is in direct contact with the protection element.

16. A semiconductor device, comprising:
    a metal gate stack over a semiconductor substrate;
    a spacer element over a sidewall of the metal gate stack, wherein the spacer element has a lower portion and an upper portion, the lower portion has a substantially uniform width, the upper portion shrinks along a direction from a bottom of the upper portion towards a top of the upper portion, and a top of the lower portion is higher than a top of the metal gate stack;
    a protection element over the metal gate stack;
    a dielectric layer surrounding the gate stack and the spacer element; and
    a conductive contact formed in the dielectric layer, wherein the conductive contact is in direct contact with the spacer element.

17. The semiconductor device as claimed in claim 16, wherein an angle between a sidewall of the conductive contact and a top surface of the spacer element is in a range from about 90 degrees to about 120 degrees.

18. The semiconductor device as claimed in claim 16, further comprising a second spacer element between the spacer element and the metal gate stack, wherein the spacer element protrudes from a top surface of the second spacer element.

19. The semiconductor device as claimed in claim 18, wherein the second spacer element contains more oxygen than the spacer element.

20. The semiconductor device as claimed in claim 16, wherein the conductive contact is in direct contact with the protection element.

* * * * *